United States Patent
Park et al.

(10) Patent No.: US 10,483,618 B2
(45) Date of Patent: Nov. 19, 2019

(54) SEMICONDUCTOR PACKAGE AND MANUFACTURING METHOD THEREOF

(71) Applicant: SAMSUNG ELECTRO-MECHANICS CO., LTD., Suwon-si (KR)

(72) Inventors: Seung Wook Park, Suwon-si (KR); Tah Joon Park, Suwon-si (KR); Jae Hyun Jung, Suwon-si (KR); Hwa Sun Lee, Suwon-si (KR); Seong Hun Na, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/997,748

(22) Filed: Jun. 5, 2018

(65) Prior Publication Data

US 2019/0131689 A1 May 2, 2019

(30) Foreign Application Priority Data

Nov. 2, 2017 (KR) ........................ 10-2017-0145398

(51) Int. Cl.
*H01L 23/552* (2006.01)
*H01Q 1/22* (2006.01)
(Continued)

(52) U.S. Cl.
CPC ..... *H01Q 1/2283* (2013.01); *G06K 19/07749* (2013.01); *H01L 23/3128* (2013.01); *H01L 23/5383* (2013.01); *H01L 23/552* (2013.01); *H01L 23/66* (2013.01); *H01L 24/97* (2013.01); *H01Q 1/44* (2013.01); *H01Q 1/48* (2013.01); *H01Q 9/045* (2013.01); *H01Q 9/0407* (2013.01); *H01Q 21/0075* (2013.01); *H01Q 21/0087* (2013.01); *H01Q 21/065* (2013.01); *H01L 2223/6677* (2013.01);
(Continued)

(58) Field of Classification Search
CPC .......... H01Q 1/2283; H01Q 1/44; H01Q 1/40; H01L 23/552; H01L 23/66; H01L 23/3128; H01L 24/97; H01L 23/5383; H01L 2924/19105; H01L 2223/6677; H01L 2224/16227; H01L 2224/97; H01L 2924/15311; H01L 2224/81; G06K 19/07749
See application file for complete search history.

(56) References Cited

U.S. PATENT DOCUMENTS 8,058,714 B2 11/2011 Noll et al.
8,256,685 B2 9/2012 Chen et al.
(Continued)

FOREIGN PATENT DOCUMENTS

KR 10-2005-0000923 A 1/2005

*Primary Examiner* — Thanh T Nguyen
(74) *Attorney, Agent, or Firm* — NSIP Law (57) ABSTRACT

A semiconductor package includes a lower package including at least one electronic device, and an antenna unit disposed on an upper surface of the lower package, wherein the antenna unit includes: a ground portion disposed on an upper surface of the lower package, a radiating portion disposed to be spaced apart from the ground portion, and a support portion separating the radiating portion and the ground portion, and at least a portion between the radiating portion and the grounding portion is empty space.

14 Claims, 9 Drawing Sheets

(51) Int. Cl.
*H01Q 1/44* (2006.01)
*G06K 19/077* (2006.01)
*H01L 23/66* (2006.01)
*H01L 23/31* (2006.01)
*H01L 23/00* (2006.01)
*H01L 23/538* (2006.01)
*H01Q 1/48* (2006.01)
*H01Q 9/04* (2006.01)
*H01Q 21/00* (2006.01)
*H01Q 21/06* (2006.01)
*H01Q 1/40* (2006.01)
*H01Q 21/30* (2006.01)

(52) U.S. Cl.
CPC ............... *H01L 2224/16227* (2013.01); *H01L 2224/97* (2013.01); *H01L 2924/15311* (2013.01); *H01L 2924/19105* (2013.01); *H01Q 1/40* (2013.01); *H01Q 21/30* (2013.01)

(56) References Cited

U.S. PATENT DOCUMENTS

| | | | |
|---|---|---|---|
| 8,988,299 B2* | 3/2015 | Kam | H01Q 1/2283 |
| | | | 257/E21.499 |
| 9,076,053 B2* | 7/2015 | Hansen | G06K 19/07749 |
| 9,129,954 B2 | 9/2015 | Yen et al. | |
| 9,620,464 B2* | 4/2017 | Baks | H01L 23/49827 |
| 2013/0009320 A1* | 1/2013 | Yoo | H01L 23/49827 |
| | | | 257/774 |
| 2017/0033062 A1 | 2/2017 | Liu et al. | |
| 2017/0330859 A1* | 11/2017 | Soares | H01L 21/76885 |
| 2019/0116670 A1* | 4/2019 | Anderson | H05K 1/185 |

\* cited by examiner

XII-XII'

FIG. 12

SEMICONDUCTOR PACKAGE AND MANUFACTURING METHOD THEREOF

CROSS-REFERENCE TO RELATED APPLICATION

This application claims the benefit under 35 USC § 119(a) of Korean Patent Application No. 10-2017-0145398 filed on Nov. 2, 2017 in the Korean Intellectual Property Office, the entire disclosure of which is incorporated herein by reference for all purposes.

BACKGROUND

Field

The disclosure relates to a semiconductor package and a manufacturing method thereof.

Description of Related Art

In order to use high-quality and high-capacity data at a high speed, frequency bands of semiconductor packages have increased. For example, for semiconductor packages for wireless communications, a technique using a millimeter wave band of 27 GHz or higher is considered.

In the millimeter wave band, a wavelength of a frequency is shortened to millimeter units, and thus, the use of conventional semiconductor package structures may degrade performance.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a semiconductor package includes a lower package including one or more electronic devices, and an antenna unit disposed on an upper surface of the lower package, wherein the antenna unit includes a ground portion disposed on an upper surface of the lower package, a radiating portion including one or more radiators disposed spaced apart from the ground portion; and a support portion separating the radiating portion and the ground portion, wherein at least a portion between the radiating portion and the ground portion is empty space.

The support portion may include a first support portion supporting a feed line for the radiating portion, and a second support portion supporting a radiator of the radiating portion.

The lower package may include a substrate and a sealing portion sealing the electronic device mounted on the substrate, and the antenna unit may be disposed on the sealing portion.

A connection portion may be disposed on a side surface of the sealing portion and electrically connect the antenna unit and the substrate.

The connection portion may include a first connection portion connecting the ground portion and a ground pad of the substrate, and a second connection portion connecting the radiating portion and a signal pad of the substrate.

The signal pad and the ground pad may be exposed outside of the sealing portion.

The semiconductor package may further include a connecting conductor electrically connecting the antenna unit and the substrate through the sealing portion.

The lower package may include a core substrate accommodating the electronic device and rewiring layers disposed on opposing surfaces of the core substrate, and the ground portion may be disposed on the rewiring layer disposed on an upper surface of the core substrate.

The semiconductor package may further include a connecting conductor electrically connecting the radiating portion and the lower package through the support portion.

The radiating portion may include a metal layer disposed on the support portion, and a plating layer disposed on the metal layer.

The semiconductor package may further include an insulating plate including the radiating portion coupled to a lower surface of the insulating plate.

A lower package may include one or more electronic devices disposed on a substrate and a sealing portion sealing the electronic device, and an antenna unit disposed on an upper surface of the sealing portion, wherein the antenna unit my include a ground portion disposed on an upper surface of the lower package, a radiating portion disposed spaced apart from the ground portion, and a connection portion disposed on a side surface of the sealing portion and electrically connecting the antenna unit and the substrate.

In one general aspect, a method of manufacturing a semiconductor package, may include preparing a lower package, and forming an antenna unit on an upper surface of the lower package, wherein the forming of the antenna unit includes forming a ground portion on an upper surface of the lower package, and stacking a support portion and a radiating portion on the ground portion, wherein at least a portion between the radiating portion and the ground portion is empty space.

The method of manufacturing a semiconductor package may include electrically connecting the antenna unit and the substrate of the lower package.

Electrically connecting the antenna unit and the substrate of the lower package may include partially cutting the lower package to expose a pad disposed in the lower package, electrically connecting the antenna unit and the pad along a cut surface of the lower package, and completely cutting the lower package.

Electrically connecting of the antenna unit and the substrate of the lower package may include forming a through hole in the lower package to expose a pad provided in the lower package, and filling the through hole with a conductive material to electrically connect the pad and the antenna unit.

The semiconductor package may transmit and receive radio signals in an ultra high frequency band.

The semiconductor package may transmit and receive radio signals in a millimeter wavelength band.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

In an embodiment, a first surface and a second surface refer to two surfaces arranged in opposite, opposing, or different directions in a member.

Figure 1:
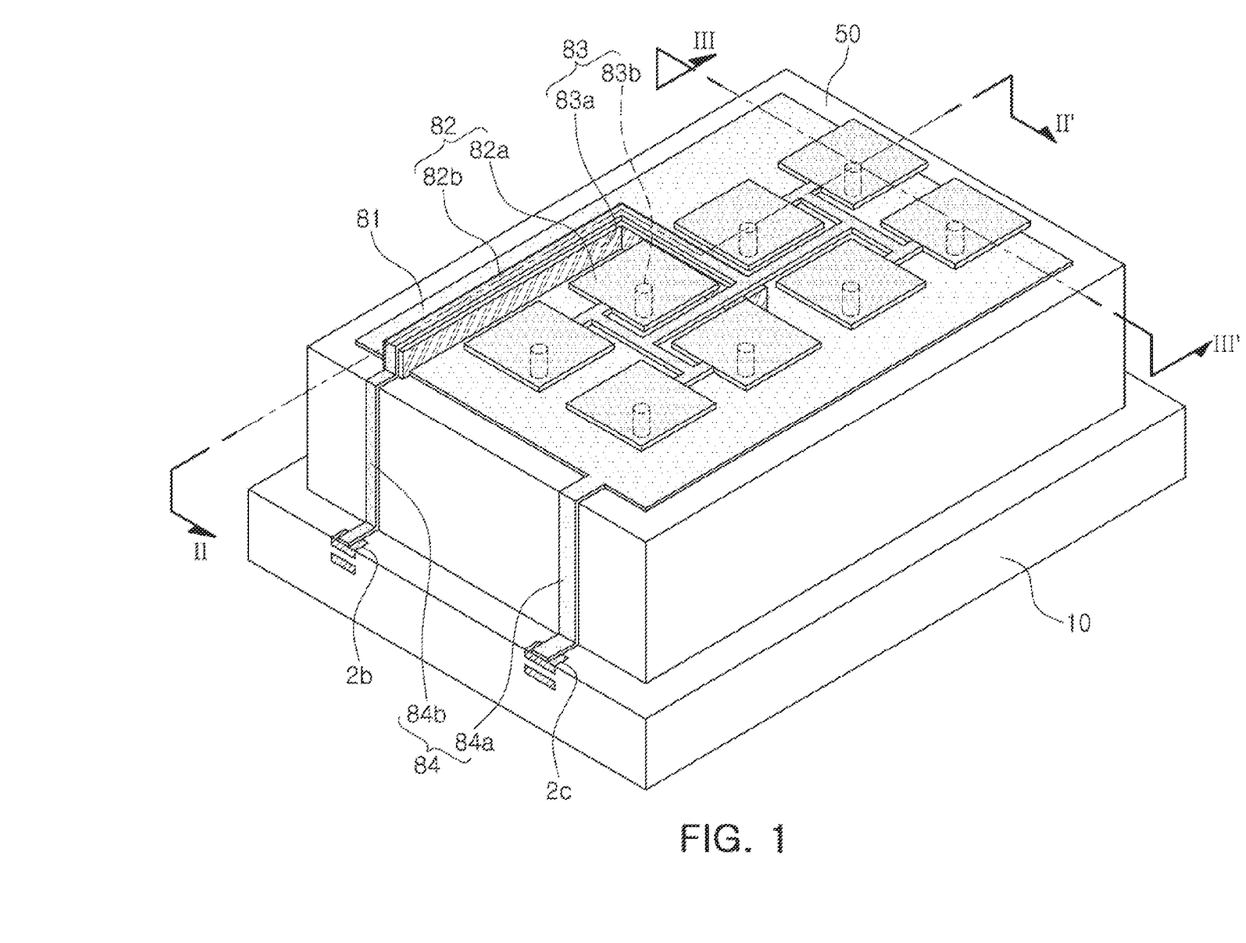
FIG. 1 is a perspective view schematically illustrating a semiconductor package according to an embodiment.
Figure 2:
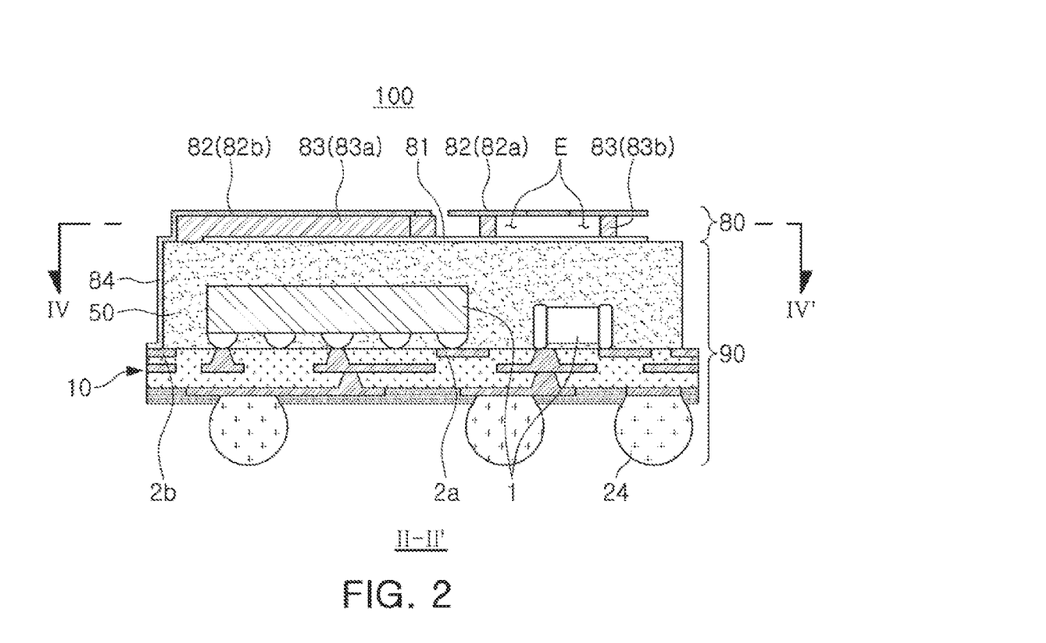
FIG. 2 is a cross-sectional view, taken along line II-II' of FIG. 1.
Figure 3:
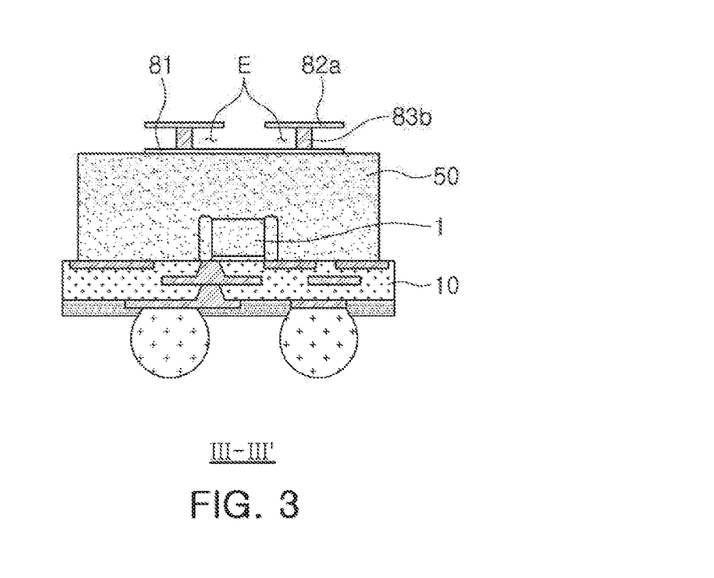
FIG. 3 is a cross-sectional view, taken along line III-III' of FIG. 1.
Figure 4:
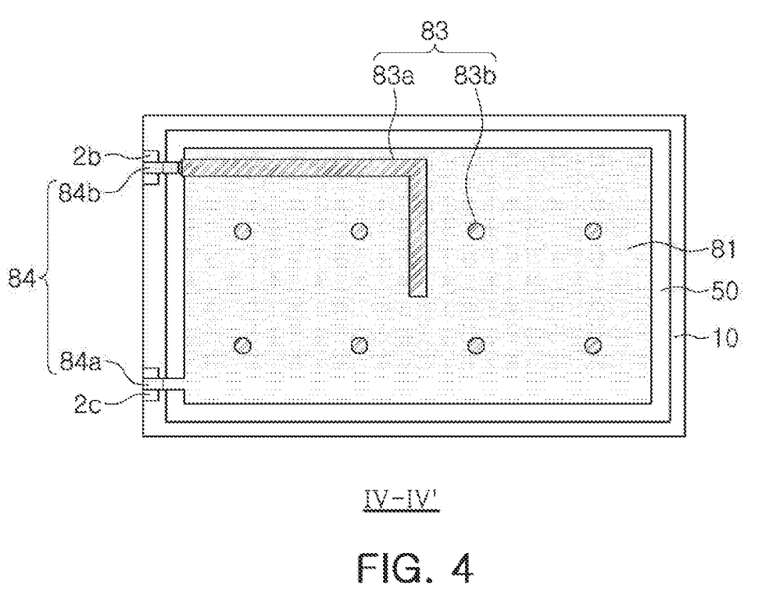
FIG. 4 is a cross-sectional view, taken along the line IV-IV' of FIG. 2.

FIG. 1 is a perspective view schematically illustrating a semiconductor package according to an embodiment and FIG. 2 is a cross-sectional view, taken along line II-II' of FIG. 1. FIG. 3 is a cross-sectional view, taken along line III-III' of FIG. 1 and FIG. 4 is a cross-sectional view, taken along line IV-IV' of FIG. 2.

Referring to FIGS. 1 to 4, a semiconductor package 100 according to an embodiment is a semiconductor package that transmits and receives radio signals using a millimeter wave band. The semiconductor package 100 includes a lower package 90 and an antenna unit 80. The lower package 90 includes a substrate (or a board) 10, an electronic device 1, and a sealing portion 50.

The substrate 10 may be formed of various kinds of substrates (for example, a printed circuit board (PCB), a flexible substrate, a ceramic substrate, a glass substrate, etc.) well known in the art.

The substrate 10 may be a multilayer substrate formed by repeatedly stacking a plurality of insulating layers and a plurality of wiring layers. However, a double-sided board formed by forming wiring layers on both sides of one insulating layer may also be used in embodiments.

The wiring layer electrically connects the electronic device 1 and the antenna unit 80 as described hereinafter. As the wiring layer, a metal having conductivity such as Cu, Ni, Al, Ag, and Au may be used.

A mounting pad 2a on which the electronic device 1 described hereinafter is mounted, a signal pad 2b, and a ground pad 2c are disposed on one surface of the substrate 10.

All the mounting pads 2a are disposed within the sealing portion 50 as described hereinafter. Meanwhile, the signal pad 2b and the ground pad 2c are disposed adjacent to a side surface of the substrate 10 or are exposed to the side surface of the substrate 10. Also, the signal pad 2b and the ground pad 2c are exposed from one surface of the substrate 10 to the outside of the sealing portion 50 as described hereinafter.

The electronic device 1 is mounted on one surface of the substrate 10 and includes at least one of a passive device and an active device. The electronic device 1 may be configured as one or a plurality of electronic devices.

The electronic device 1 is electrically connected to the antenna unit 80 as described hereinafter and performs wireless communications through the antenna unit 80. To this end, the electronic device 1 may include, but is not limited to, multiple analog components (MAC) or a baseband signal processing circuit.

The sealing portion 50 is formed on one surface of the substrate 10. Thus, the sealing portion 50 is arranged to embed the electronic devices 1 mounted on one surface of the substrate 10.

The sealing portion 50 fills a space between the electronic devices 1 to prevent occurrence of an electrical short circuit between the electronic devices 1 and covers the outside of the electronic devices 1 to fix the electronic devices 1 to the substrate 10 to safely protect the electronic devices 1 from an external impact.

The sealing portion 50 is formed of an insulating material. In an embodiment, an epoxy molding compound (EMC) is used as a material of the sealing portion 50 but is not limited thereto.

The sealing portion 50 according to an embodiment is formed in a hexahedral shape as a whole. However, a shape of the sealing portion 50 is not limited thereto and may be modified to various shapes as long as an upper surface of the sealing portion 50 may be formed flat.

In an embodiment, an upper surface of the sealing portion 50 is formed to have an area smaller than one surface of the substrate 10. This structure exposes the signal pad and the connection pad to the outside during a manufacturing process of the semiconductor package, and this may be clearly understood through the description of the manufacturing method.

A connection terminal 24 is coupled to the other surface of the substrate 10.

When the semiconductor package 100 is mounted on a main board (not shown) provided in an electronic device, the connection terminal 24 physically and electrically connects the semiconductor package 100 and the main board. The connection terminal 24 may be formed of a conductive adhesive such as solder but is not limited thereto.

The antenna unit 80 is disposed on an upper surface of the lower package 90. Specifically, the antenna unit 80 is disposed on an upper surface of the sealing portion 50 and electrically connected to the substrate 10 and the electronic device 1. The antenna unit 80 of an embodiment may radiate or receive an RF signal of a millimeter wave band.

The antenna unit 80 includes a radiating portion 82, a grounding portion 81, a support portion 83, and a connection portion 84.

The radiating portion 82 is disposed at the top of the semiconductor package 100 and is supported by a support portion 83 described hereinafter.

The radiating portion 82 of an embodiment is configured as an array antenna. Thus, the radiating portion 82 includes a plurality of radiators 82a and a feed line 82b electrically connecting the radiators 82a to the substrate 10.

A radiator 82a is formed as a square patch and a plurality of the radiators 82a are spaced apart from each other at regular intervals.

However, a configuration of radiator 82a is not limited thereto. For example, radiator 82a may have various other shapes such as a meandering shape or a polygonal shape as long as it can perform wireless communications in a millimeter wave frequency band.

The feed line 82b electrically connects each of the radiators 82a to a second connection portion 84b as described hereinafter. The feed line 82b is formed of the same material as that of the radiator 82a and disposed on the same plane on which the radiator 82a is provided.

The ground portion 81 is disposed on an upper surface of the sealing portion 50. The radiating portion 82 is spaced apart from the ground portion 81 at a predetermined distance so as to be disposed above the ground portion 81.

The ground portion 81 is formed to have an area larger than that of the radiating portion 82. Thus, when the radiating portion 82 is projected onto the ground portion 81, the entire area of the radiating portion 82 may be disposed within the ground portion 81. However, the present disclosure is not limited thereto.

A support portion 83 is disposed between the radiating portion 82 and the ground portion 81. Therefore, the radiating portion 82 is disposed on the support portion 83, and the support portion 83 serves to support the radiating portion 82.

The support portion 83 does not completely fill the space between the radiating portion 82 and the ground portion 81 but occupies only a portion thereof to support the radiating portion 82. Thus, an empty space E in which air is disposed is provided between the radiating portion 82 and the ground portion 81.

In an embodiment, the support portion 83 may be divided into a first support portion 83a supporting the feed line 82b and a second support portion 83b supporting the radiator 82a.

The first support portion 83a is formed along the feed line 82b and is not formed under the radiator 82a. However, the present disclosure is not limited thereto and may be configured to partially support the radiator 82a.

In an embodiment, the first support portion 83a is formed as a continuous wall but it is not limited thereto and the first support portion 83a may be formed discontinuously.

The second support portion 83b is disposed below the radiator 82a to support the radiator 82a.

The second support portion 83b is in contact with the radiator 82a with an area smaller than the area of the radiator 82a to support the radiator 82a. In an embodiment, a case in which one second support portion 83b supports one radiator 82a is described. Specifically, the second support portion 83b is disposed at the center of the radiator 82a and has a columnar shape to support the radiator 82a.

However, the configuration of the present disclosure is not limited thereto and may be variously modified such that a plurality of second support portions 83b are configured to support the one radiator 82a and support edges of the radiator 82a, instead of the center of the radiator 82a.

The support portion 83 of an embodiment is not limited in shape and size as long as it separates the radiator 82a from the ground portion 81 and supports the radiator 82a such that at least a portion of the radiator 82a directly faces the support portion 83.

The support portion 83 is formed of an insulating material such as a polymer and is bonded to a surface of the ground portion 81. However, the disclosure is not limited thereto and the support portion 83 may be directly bonded to the sealing portion 50. In this case, the ground portion 81 is disposed in a region of the upper surface of the sealing portion 50 where the support portion 83 is not disposed.

The connection portion 84 is disposed on a surface of the sealing portion 50 and includes a first connection portion 84a electrically connecting the ground portion 81 and the substrate 10 and a second connection portion 84b connecting the radiating portion 82 and the substrate 10.

The first connection portion 84a is disposed on a side surface of the sealing portion 50 and connected to the ground pad 2c exposed from one surface of the substrate 10 to the outside of the sealing portion 50. The second connection portion 84b is disposed on a side surface of the sealing portion 50 and a side surface of the first support portion 83a of the support portion 83 and connected to the signal pad 2b exposed to the outside of the sealing portion 50.

The first connection portion 84a and the second connection portion 84b may be disposed together on the same side among the four sides of the sealing portion 50. However, the present disclosure is not limited thereto and the first connection portion 84a and the second connection portion 84b may be arranged on different sides. In an embodiment, a case in which the connection portions 84 are disposed on only one side among the four sides of the sealing portion 50 is illustrated as an example, but the connection portions 84 may be disposed on a plurality of sides, respectively.

In the semiconductor package 100 according to an embodiment configured as described above, the antenna unit 80 is disposed on the upper surface of the sealing portion 50. Thus, a distance between the antenna unit 80 and the electronic device 1 may be minimized, minimizing loss of signal power and reducing deterioration of reflectivity.

Also, in order to minimize loss, the antenna unit 80 according to an embodiment has the empty space E in which an air layer is present between the radiating portion 82 and the ground portion 81. When air is used as a dielectric layer, a loss factor is zero. Thus, since loss in the antenna unit 80 is reduced or minimized, the transmission/reception efficiency of the antenna may be increased in an ultra-high frequency band such as a millimeter wave band.

Figure 6:
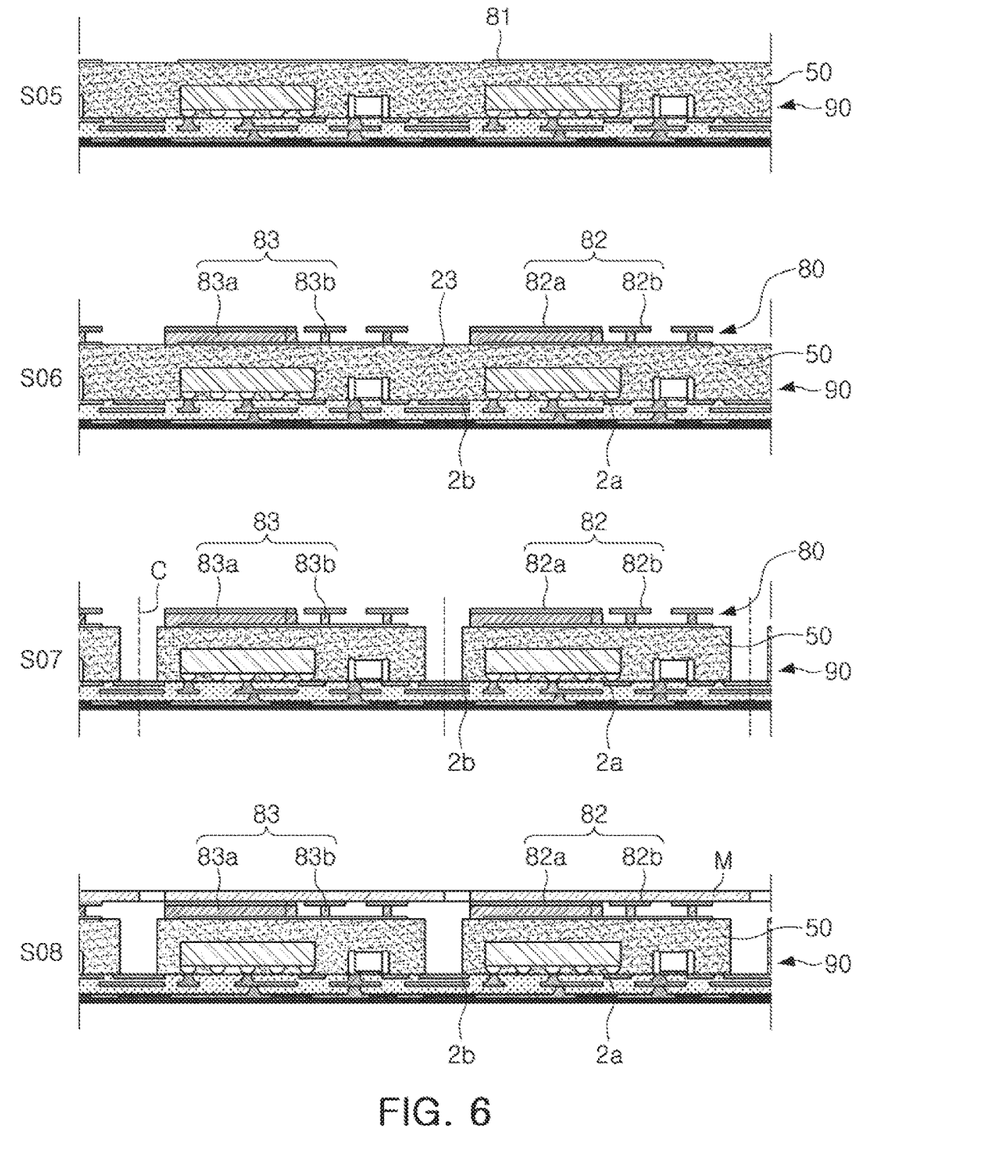
Figure 7:
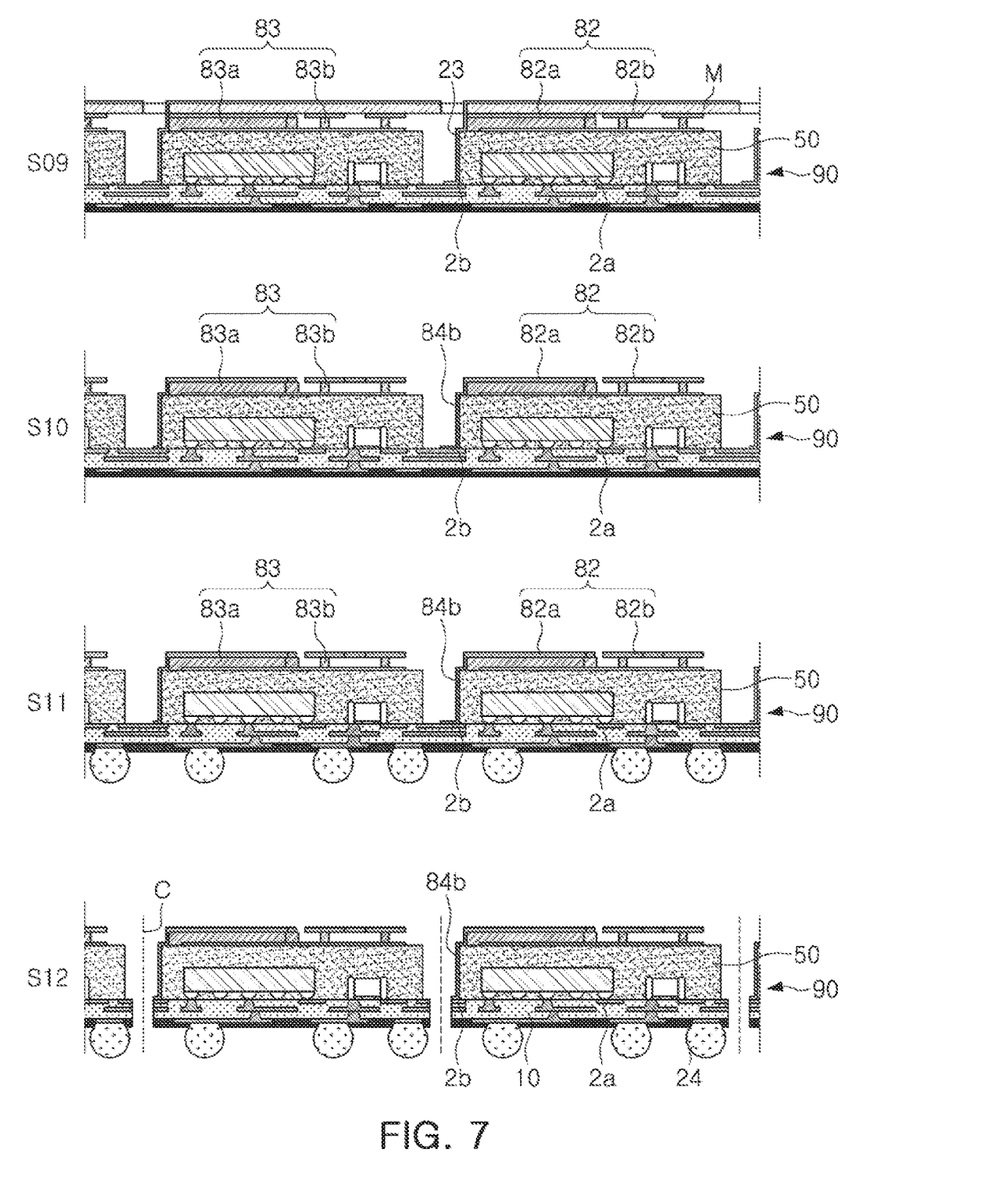

Hereinafter, a method of manufacturing the semiconductor package illustrated in FIG. 1 will be described with reference to FIGS. 5 through 7. For the purposes of description, FIGS. 5 through 7 show cross-sections, taken along line III-III' of FIG. 1.

According to the method of manufacturing a semiconductor package according to an embodiment, portions of the lower package 90 and the antenna unit 80 are separately manufactured and coupled.

Figure 5:
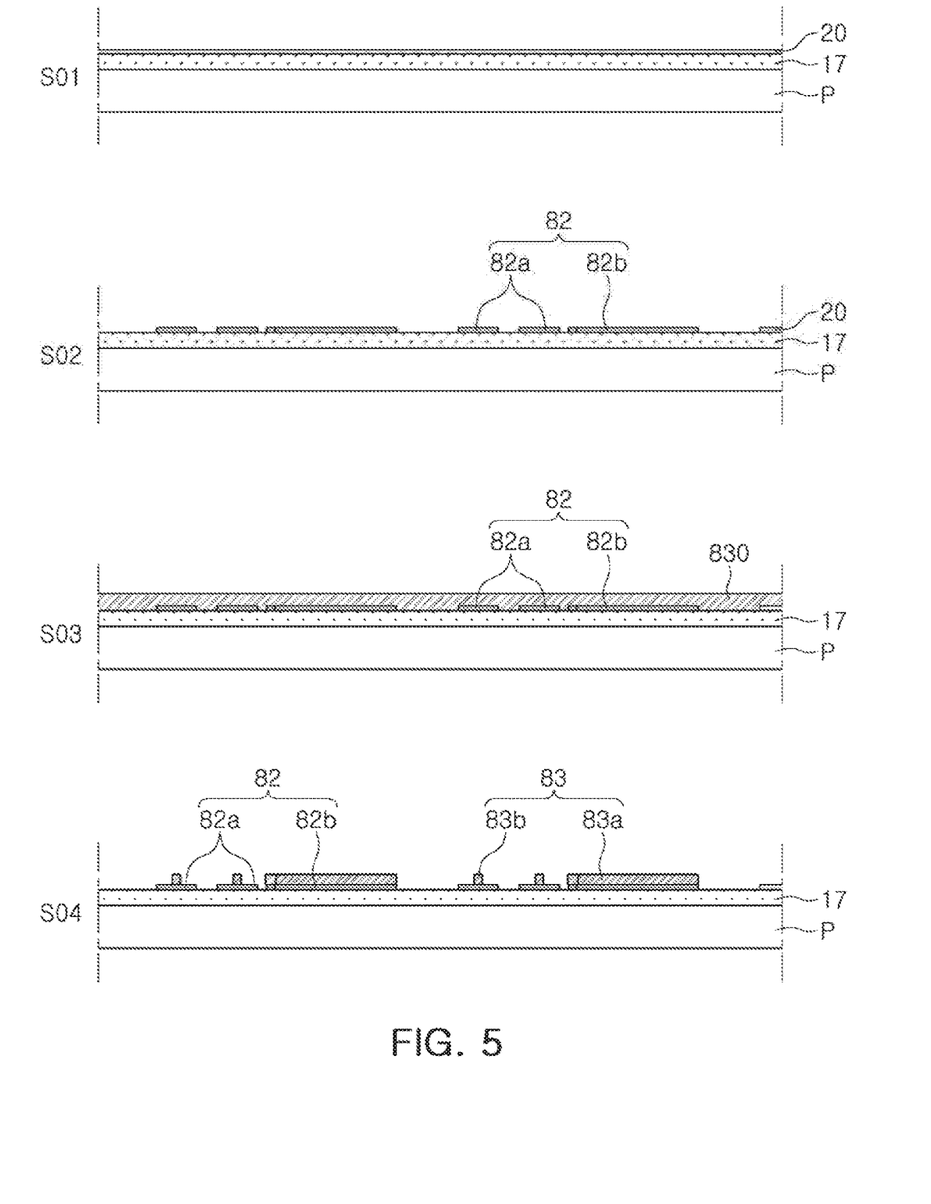
FIGS. 5 to 7 are views schematically illustrating a method of manufacturing a semiconductor package illustrated in FIG. 1.

Referring to a method of manufacturing the antenna unit 80, as illustrated in FIG. 5, a first metal layer 20 is first formed on a carrier substrate P in operation S01. Here, the first metal layer 20 may be formed of copper (Cu). The first metal layer 20 may be disposed on the carrier substrate P by the medium of a bonding member 17 such as an adhesive tape.

Thereafter, a mask layer (not shown) is formed on the first metal layer 20 and a portion of the first metal layer 20 is removed to form the radiating portion 82 in operation S02.

The mask layer may be formed of a photosensitive film (dry film photoresist (DFR)) or a photoresist (PR, Photoresist) but is not limited thereto.

Thereafter, a support layer 830 is stacked on the radiating portion 82 in operation S03. The support layer 830 may be formed to cover the entire radiating portion 82 or may be partially formed.

The support layer 830 is later formed as the support portion 83. Accordingly, the support layer 830 may be formed of an insulating material such as a resin or polymer, but the material of the support layer 830 is not limited thereto.

Thereafter, a portion of the support layer 830 is removed to form the support portion 83 in operation S04. During this process, the support portion 83 is separately formed as the first support portion 83a supporting the feed line 82b and the second support portion 83b supporting the radiator 82a.

Subsequently, the lower package 90 is prepared in operation 505. The lower package 90 provided at this stage is a package in which a plurality of packages are manufactured by package regions on a single substrate strip, rather than a form cut into individual packages as illustrated in FIG. 1. However, the present disclosure is not limited thereto.

Also, in the lower package 90 provided at this stage, the ground portion 81 is disposed on the sealing portion 50. Accordingly, the ground portion 81 may be formed together with the lower package 90 in the process of manufacturing the lower package 90.

For example, the ground portion 81 may be formed by forming a second metal layer on the entire upper surface of the sealing portion 50 and subsequently removing a portion of the second metal layer. The second metal layer may be formed of copper (Cu) but is not limited thereto.

When the lower package 90 is prepared, the structure formed on the carrier substrate P is transferred to the lower package 90 in operation S06. Here, the structure is transferred such that the support portion 83 is bonded to a surface of the ground portion 81.

When the transfer is completed, the carrier substrate P is removed. Accordingly, the radiating portion 82 is exposed to the outside. At this stage, the adhesive member 17 is also removed together with the carrier substrate P.

Subsequently, the lower package 90 is partially cut along a cutting line C in operation S07. This operation is performed to expose the signal pad 2b and the ground pad 2c formed on the substrate 10.

Accordingly, in cases where the signal pad 2b and the ground pad 2c are disposed on the surface of the substrate, the signal pad 2b and the ground pad 2c may be exposed to the outside by cutting only the sealing portion 50. However, in cases where the signal pad 2b and the ground pad 2c are disposed within the substrate, a portion of the substrate 10 is cut together with the sealing portion 50 to expose the signal pad 2b and the ground pad 2c to the outside.

Thereafter, the connection portion 84 is formed on the partially cut surface. The connection portion 84 may be formed through an operation S08 of disposing a mask layer M on the radiating portion 82, an operation S09 of forming a third metal layer 23 on the cut surface based thereon, and an operation S10 of removing the mask layer M.

Here, the mask layer M is also disposed on the cut surface so that the third metal layer 23 is formed only in the portion where the connection portion 84 is formed. The third metal layer 23 may be formed through sputtering but is not limited thereto.

As the mask layer M is removed, the third metal layer 23 is formed as the first connection portion 84a (of FIG. 2)

connecting the ground portion 81 and the grounding pad 2c and the second connection portion 84b connecting the radiating portion 82 and the signal pad 2b.

Thereafter, the connection terminal 24 is mounted on the substrate 10 in operation S11, and the lower package 90 is completely cut along the cutting line C in operation S12 to form a semiconductor package illustrated in FIG. 1.

Meanwhile, the semiconductor package according to an embodiment is not limited to the above-described embodiments and therewith various modifications also exist.

Figure 8:
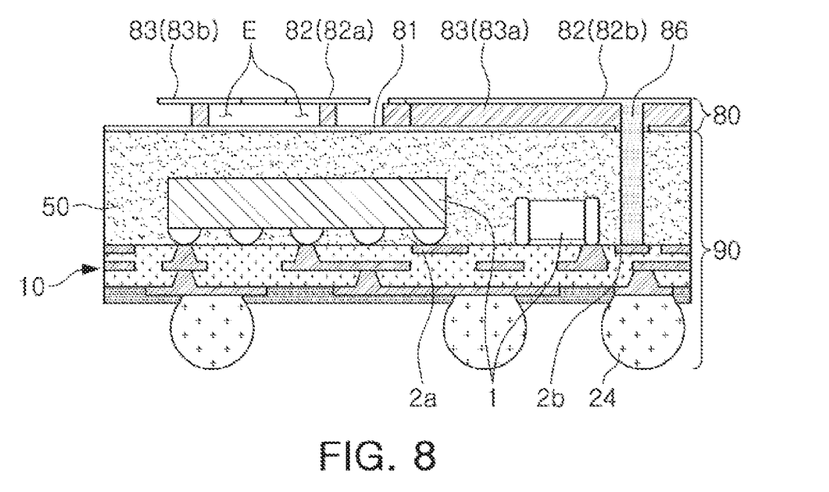
FIG. 8 is a cross-sectional view schematically illustrating a semiconductor package according to an embodiment.

FIG. 8 is a cross-sectional view schematically illustrating a semiconductor package according to an embodiment.

The semiconductor package of an embodiment has a connecting conductor 86 arranged to penetrate through the sealing portion 50, without having the connection portion (84 of FIG. 1) described above.

One end of the connecting conductor 86 is bonded to the substrate 10 and the other end thereof is connected to the radiating portion 82 or the ground portion 81. In FIG. 8, only the connecting conductor 86 connecting the radiating portion 82 and the substrate 10 is illustrated. In this case, the connecting conductor 86 also penetrates through the support portion 83 and connects the radiating portion 82 and the signal pad 2b of the substrate 10.

Although not shown, a connecting conductor connecting the ground portion 81 and a ground pad (not shown) of the substrate 10 is also provided.

The connecting conductor 86 may be formed of a conductive material, for example, copper, gold, silver, aluminum, or an alloy thereof. The connecting conductor 86 may be configured in various forms as long as it can electrically connect the substrate 10 and the antenna unit 80.

The method of manufacturing the semiconductor package according to an embodiment may include an operation of forming a through hole penetrating through the support portion 83 and the sealing portion 50 and filling the through hole with a conductive material to form the connecting conductor 86, after the operation S06 described above.

The through hole may be formed using a laser drill but is not limited thereto. The connecting conductor 86 may be formed by filling the through hole with solder or conductive paste or through plating.

Figure 9:
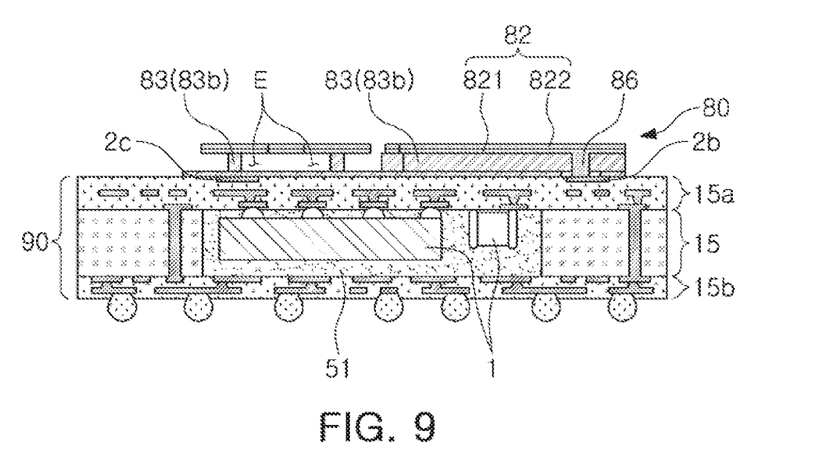
FIG. 9 is a cross-sectional view schematically illustrating a semiconductor package according to an embodiment.

FIG. 9 is a cross-sectional view schematically illustrating a semiconductor package according to an embodiment.

Referring to FIG. 9, in the semiconductor package according to an embodiment, rewiring portions 15a and 15b are formed on opposing surfaces of a core substrate 15 in which an electronic device 1 is accommodated, and the antenna unit 80 is disposed on the rewiring portion 15a disposed above, among the two rewiring portions 15a and 15b.

Since the antenna unit 80 according to an embodiment is disposed directly on the rewiring portion 15a in which a circuit wiring is formed, the ground portion 81 is directly connected to the ground pad 2c of the lower package 90.

The radiating portion 82 is connected to the signal pad 2b of the lower package 90 through a connecting conductor 86a penetrating through the support portion 83. However, without being limited thereto, various modifications may be made such that the connecting part (84 of FIG. 1) is formed along a side surface of the support portion 83 to connect the radiating portion 82 and the signal pad 2b, similarly to embodiments described above.

Also, in an embodiment, the radiating portion 82 may include a metal layer 821 and a plating layer 822 stacked on the metal layer 821 in a plating manner. However, without being limited thereto, various modification examples exist where the plating layer 822 is omitted and the radiating portion 82 is formed only as the metal layer 821.

Figure 10:
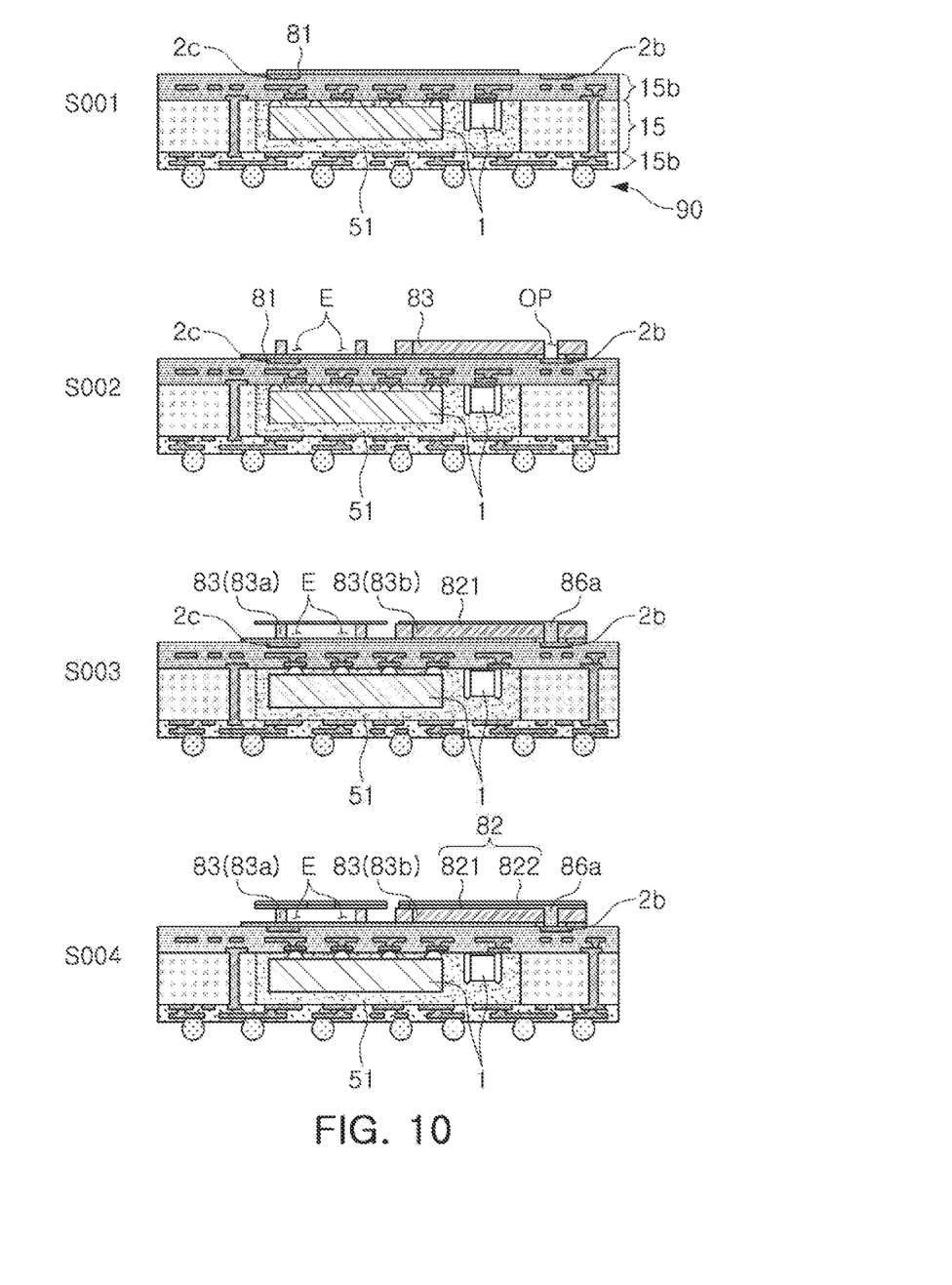
FIG. 10 is a view schematically illustrating a method of manufacturing the semiconductor package illustrated in FIG. 9.

Hereinafter, a method of manufacturing the semiconductor package illustrated in FIG. 8 will be described with reference to FIG. 10.

First, the ground portion 81 is formed on an upper surface of the lower package 90 in operation S001. The ground portion 81 may be formed through a photolithography process but is not limited thereto.

Next, the support portion 83 is formed on an upper surface of the lower package 90 in operation S002. The support portion 83 may be formed by forming a support layer (not shown) on the ground portion 81 and then patterning the same.

During this process, the inside of the support portion 83 is partially removed to form an opening OP. The opening OP is formed to completely penetrate through the support portion 83 and the signal pad 2b of the lower package 90 is exposed to the outside through the opening OP. The opening OP is used as a space in which empty space E is present between the radiating portion 82 and the ground portion 81 and the connecting conductor 86a are disposed.

Thereafter, the metal layer 821 is formed on the support 83 in operation 003. The metal layer 821 may be formed by stacking a metal member on the support portion 83 and then removing a portion from the metal member. During this process, the opening OP in which the signal pad 2b is disposed is exposed to the outside of the metal layer 821.

The metal member may be formed as a thin metal plate. Also, the metal member may be stacked to cover the support portion 83 completely.

The metal member may be formed as the metal layer 821 through a photolithography process but is not limited thereto.

Thereafter, the opening OP in which the signal pad 2b is disposed is filled with a conductive material to form the connecting conductor 86a in operation 004. This operation may be performed through a plating process or a silk screen process but is not limited thereto.

During this process, the conductive material is also stacked on the upper surface of the metal layer 821 to form the plating layer 822.

Meanwhile, an operation of forming a seed layer on the inside of the opening OP and on an upper surface of the metal layer 821 may be additionally performed to improve reliability of bonding of the connecting conductor 86a or the plating layer 822.

In this case, the connecting conductor 86a may be completed through an operation of forming the seed layer on the surface of the metal layer 821 and inside the opening OP, an operation of forming a mask layer on the seed layer, an operation of filling the opening OP with a conductive material, and an operation of removing the mask layer and seed layer.

The seed layer may be formed of a material such as titanium (Ti), aluminum (Al), copper (Cu), or the like, but the present disclosure is not limited thereto.

Figure 11:
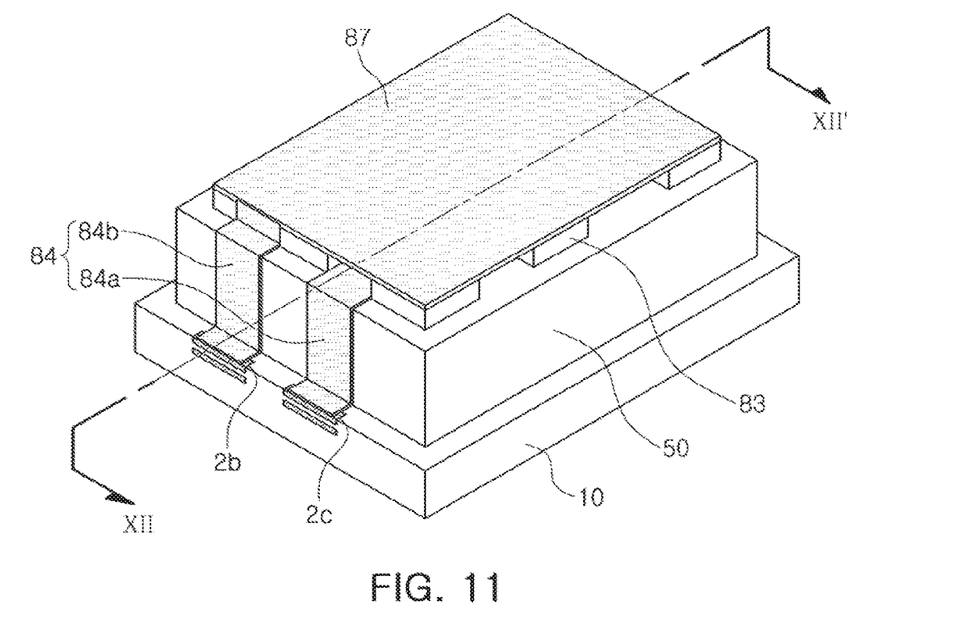
FIG. 11 is a perspective view schematically illustrating a semiconductor package according to an embodiment.
Figure 12:
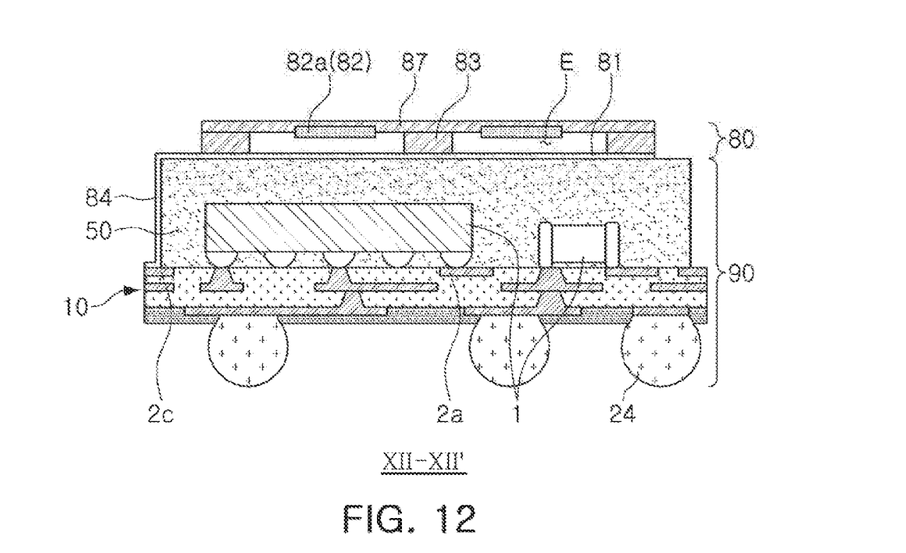
FIG. 12 is a cross-sectional view, taken along line XII-XII' of FIG. 11.

FIG. 11 is a perspective view schematically illustrating a semiconductor package according to an embodiment, and FIG. 12 is a cross-sectional view, taken along line XII-XII' of FIG. 11.

Referring to FIGS. 11 and 12, the antenna unit 80 of an embodiment is provided with an insulating plate 87 on the support portion 83. Also, the radiating portion 82 is disposed on a lower surface of the insulating plate 87. Here, the lower surface of the insulating plate 87 refers to a surface facing the ground portion 81.

A portion of the radiating portion 82 may be inserted into the insulating plate 87. In this case, a contact area between the radiating portion 82 and the insulating plate 87 increases, increasing a bonding force between the radiating portion 82 and the insulating plate 87. However, the present disclosure is not limited thereto and the lower surface of the insulating plate 87 may be formed to be flat and the radiating portion 82 may be adhered to the lower surface of the insulating plate 87 using an adhesive member such as an adhesive tape.

In an embodiment, the support portion 83 supports the insulating plate 87, rather than supporting the radiating portion 82. Therefore, the radiating portion 82 is disposed such that the entirety thereof, not a portion, directly faces the ground portion 81, and since only the empty space E is between the radiating portion 82 and the ground portion 81, only an air layer is disposed therein.

However, the configuration of the present disclosure is not limited thereto and various modifications may be made such that the support portion 83 partially supports the radiating portion 82, similarly to an embodiment described above, or such that the support portion 83 is arranged along a feed line (not shown) to support both the feed line 82b and the insulating plate 87.

In an embodiment, as illustrated in FIG. 11, the ground portion 81 and the radiating portion 82 are connected to the substrate 10 through the connecting part 84. However, the present disclosure is not limited thereto and various modifications may be made such that the ground portion 81 and the radiating portion 82 are connected to the substrate 10 through the connecting conductor 86 as in embodiments of FIG. 8 or 9.

For example, embodiments described above may be combined with each other. For example, the antenna unit illustrated in FIG. 8 may be manufactured through the method illustrated in FIGS. 5 through 7, and likewise, the antenna unit illustrated in FIG. 1 may be manufactured through the method illustrated in FIG. 10.

As set forth above, in the semiconductor package according to embodiments, the antenna unit is disposed on the upper surface of the sealing portion. Therefore, the distance between the antenna unit and the electronic device may be minimized. Also, since the empty space in which an air layer is disposed is provided between the radiating portion and the ground portion, loss made in the antenna unit may be minimized, and thus, transmission and reception efficiency of the antenna may be increased in an ultra-high frequency band such as a millimeter wave band.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor package comprising:
a lower package comprising one or more electronic devices; and
an antenna unit disposed on an upper surface of the lower package,
wherein the antenna unit includes:
a ground portion disposed on an upper surface of the lower package;
a radiating portion comprising one or more radiators disposed to be spaced apart from the ground portion; and
a support portion separating the radiating portion and the ground portion,
wherein at least a portion between the radiating portion and the ground portion is empty space.

2. The semiconductor package of claim 1, wherein the support portion comprises:
a first support portion supporting a feed line for the radiating portion; and
a second support portion supporting a radiator of the radiating portion.

3. The semiconductor package of claim 1, wherein the lower package includes a substrate and a sealing portion sealing the electronic device mounted on the substrate, and
the antenna unit is disposed on the sealing portion.

4. The semiconductor package of claim 3, further comprising:
a connection portion disposed on a side surface of the sealing portion and electrically connecting the antenna unit and the substrate.

5. The semiconductor package of claim 4, wherein the connection portion comprises:
a first connection portion connecting the ground portion and a ground pad of the substrate; and
a second connection portion connecting the radiating portion and a signal pad of the substrate.

6. The semiconductor package of claim 5, wherein the signal pad and the ground pad are exposed outside of the sealing portion.

7. The semiconductor package of claim 3, further comprising:
a connecting conductor electrically connecting the antenna unit and the substrate through the sealing portion.

8. The semiconductor package of claim 1, wherein the lower package includes a core substrate accommodating the electronic device and rewiring layers disposed on opposing surfaces of the core substrate, and
the ground portion is disposed on the rewiring layer disposed on an upper surface of the core substrate.

9. The semiconductor package of claim 8, further comprising:
a connecting conductor electrically connecting the radiating portion and the lower package through the support portion.

10. The semiconductor package of claim 1, wherein the radiating portion comprises:
a metal layer disposed on the support portion; and
a plating layer disposed on the metal layer.

11. The semiconductor package of claim 1, further comprising:
an insulating plate comprising the radiating portion coupled to a lower surface of the insulating plate.

12. The semiconductor package of claim 1, wherein the semiconductor package transmits and receives radio signals in an ultra high frequency band.

13. The semiconductor package of claim 1, wherein the semiconductor package transmits and receives radio signals in a millimeter wavelength band.

14. A semiconductor package comprising:
- a lower package comprising one or more electronic devices disposed on a substrate and a sealing portion sealing the electronic device; and
- an antenna unit disposed on an upper surface of the sealing portion, wherein the antenna unit comprises:
- a ground portion disposed on an upper surface of the lower package;
- a radiating portion disposed spaced apart from the ground portion; and
- a connection portion disposed on a side surface of the sealing portion and electrically connecting the antenna unit and the substrate.

\* \* \* \* \*

UNITED STATES PATENT AND TRADEMARK OFFICE
CERTIFICATE OF CORRECTION

PATENT NO. : 10,483,618 B2  
APPLICATION NO. : 15/997748  
DATED : November 19, 2019  
INVENTOR(S) : Seung Wook Park et al.

Page 1 of 1

It is certified that error appears in the above-identified patent and that said Letters Patent is hereby corrected as shown below:

On the Title Page

Item (73) Assignee, Replace "Samsung Electronics Co., Ltd., Suwon-si (KR)" with "Samsung Electro-Mechanics Co., Ltd., Suwon-si (KR)"

Signed and Sealed this  
Thirty-first Day of December, 2019

Andrei Iancu  
*Director of the United States Patent and Trademark Office*